(12) United States Patent
Kurashima (10) Patent No.: US 10,497,640 B2
(45) Date of Patent: Dec. 3, 2019

(54) HEAT PIPE

(71) Applicant: Shinko Electric Industries Co., LTD., Nagano-Ken (JP)

(72) Inventor: Nobuyuki Kurashima, Nagano (JP)

(73) Assignee: Shinko Electric Industries Co., LTD., Nagano-Ken (JP)

( * ) Notice: Subject to any disclaimer, the term of this patent is extended or adjusted under 35 U.S.C. 154(b) by 17 days.

(21) Appl. No.: 16/005,776

(22) Filed: Jun. 12, 2018

(65) Prior Publication Data

US 2019/0013257 A1 Jan. 10, 2019

(30) Foreign Application Priority Data

Jul. 4, 2017 (JP) .................................. 2017-130943

(51) Int. Cl.
*F28F 7/00* (2006.01)
*F28D 15/00* (2006.01)
*H01L 23/427* (2006.01)
*F28D 15/04* (2006.01)
*F28D 15/02* (2006.01)

(52) U.S. Cl.
CPC ........ *H01L 23/427* (2013.01); *F28D 15/0233* (2013.01); *F28D 15/046* (2013.01); *F28D 2015/0225* (2013.01)

(58) Field of Classification Search
CPC ............. F28D 15/0241; F28D 15/0233; F28D 15/0258; F28D 15/046; F28D 2015/0225; F25B 15/02; H01C 23/427

USPC ........................................................ 165/80.4
See application file for complete search history.

(56) References Cited

U.S. PATENT DOCUMENTS

| 4,043,387 | A | * | 8/1977 | Lamp | ................... F28D 15/0258 165/104.27 |
| 5,201,196 | A | * | 4/1993 | Faghri | ..................... F25B 15/02 62/489 |
| 5,642,776 | A | * | 7/1997 | Meyer, IV | .......... F28D 15/0233 165/104.26 |
| 6,446,706 | B1 | * | 9/2002 | Rosenfeld | ........... F28D 15/0241 165/104.26 |

FOREIGN PATENT DOCUMENTS

| JP | 2015-010765 A | 1/2015 |
| JP | 2016-188734 A | 11/2016 |

\* cited by examiner

*Primary Examiner* — Davis D Hwu
(74) *Attorney, Agent, or Firm* — Wolf, Greenfield & Sacks, P.C.

(57) ABSTRACT

A heat pipe containing a working fluid includes a first metal layer and a second metal layer. The first metal layer includes an upper surface and bottomed holes depressed from the upper surface. The second metal layer includes a lower surface that is joined with the upper surface of the first metal layer and a recess that is depressed from the lower surface. The recess forms a vapor layer in which vapor vaporized from the working fluid moves. Adjacent bottomed holes are in communication with each other so that the bottomed holes form a liquid layer in which the working fluid liquefied from the vapor moves.

7 Claims, 7 Drawing Sheets

HEAT PIPE

CROSS-REFERENCE TO RELATED APPLICATIONS

This application is based upon and claims the benefit of priority from prior Japanese Patent Application No. 2017-130943, filed on Jul. 4, 2017, the entire contents of which are incorporated herein by reference.

FIELD

This disclosure relates to a heat pipe and a method for manufacturing a heat pipe.

BACKGROUND

Heat pipes, vapor chambers, and the like are known as cooling devices used to cool heat-generating components such as a central processing unit (CPU) installed in an electronic device (refer to, for example, Japanese Laid-Open Patent Publication Nos. 2015-10765 and 2016-188734). A cooling device includes a working fluid. The cooling device uses phase transition of the working fluid to transfer heat. This cools the heat-generating component to which the cooling device is attached.

SUMMARY

Electronic devices such as portable devices have become thin. Thus, there is a need to reduce the thickness of cooling devices.

One embodiment is a heat pipe containing a working fluid. The heat pipe includes a first metal layer and a second metal layer. The first metal layer includes an upper surface and a plurality of bottomed holes depressed from the upper surface. The second metal layer includes a lower surface that is joined with the upper surface of the first metal layer and a recess that is depressed from the lower surface. The recess forms a vapor layer in which vapor vaporized from the working fluid moves. Adjacent ones of the plurality of bottomed holes are in communication with each other so that the plurality of bottomed holes form a liquid layer in which the working fluid liquefied from the vapor moves.

A further embodiment is a method for manufacturing a heat pipe. The method includes forming a plurality of bottomed holes in a first metal plate by etching the first metal plate from an upper surface of the first metal plate. The method also includes forming a recess in a second metal plate by etching a second metal plate from a lower surface of the second metal plate. The method also includes joining the lower surface of the second metal plate with the upper surface of the first metal plate. The method further includes feeding a cavity formed by the joined first and second metal plates with a working fluid through an inlet and sealing the inlet. The recess forms a vapor layer in which vapor vaporized from the working fluid moves. The forming a plurality of bottomed holes include partially overlapping adjacent ones of the plurality of bottomed holes so that the adjacent ones of the plurality of bottomed holes are in communication and so that the plurality of bottomed holes form a liquid layer in which the working fluid liquefied from the vapor moves.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Embodiments will now be described with reference to the accompanying drawings. In the drawings, elements are illustrated for simplicity and clarity and have not necessarily been drawn to scale. To facilitate understanding, hatching lines may not be illustrated or be replaced by shadings in the cross-sectional drawings.

In the description hereafter, a plan view will refer to a view of a subject taken in the vertical direction (e.g., vertical direction with respect to plane of FIG. 1A), and planar shape will refer to the shape of a subject as viewed in the vertical direction.

First Embodiment

Figure 1A:
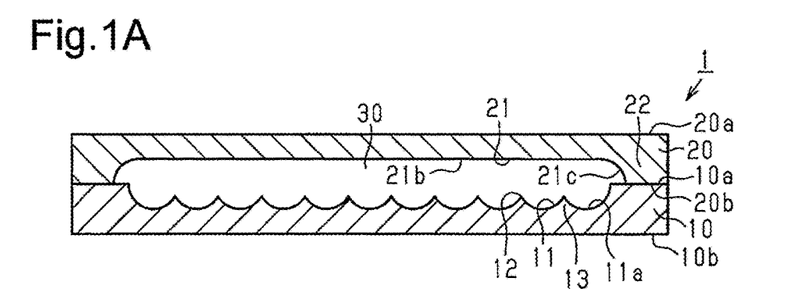
FIG. 1A is a schematic cross-sectional view of a first embodiment of a heat pipe.

A first embodiment of a heat pipe 1 will now be described. Referring to FIG. 1A, the heat pipe 1 is a laminated structure of a first metal layer 10 and a second metal layer 20.

Figure 2:
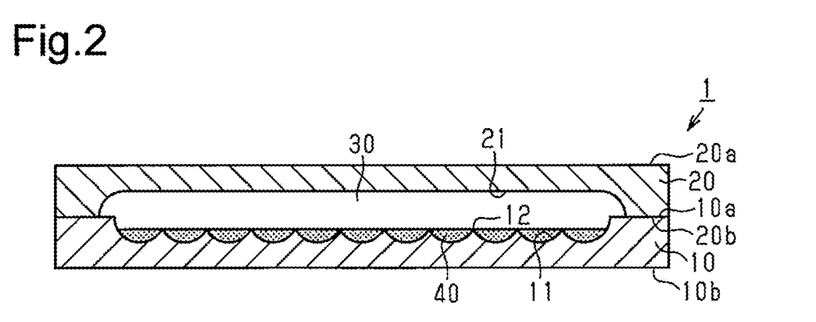
FIG. 2 is a schematic cross-sectional view illustrating the functions of the heat pipe.

The first metal layer 10 includes an upper surface 10a and a lower surface 10b. The second metal layer 20 includes an upper surface 20a and a lower surface 20b. The lower surface 20b of the second metal layer 20 is joined with the upper surface 10a of the first metal layer 10. The first and second metal layers 10 and 20 are joined through a solid state bonding process such as diffusion bonding or thermocompression bonding. The first metal layer 10 and the second metal layer 20 when joined together form a sealed cavity 30. Referring to FIG. 2, in the heat pipe 1, the sealed cavity 30 contains a working fluid 40.

The first metal layer 10 may be formed from, for example, a material having high thermal conductivity. For example, copper, a copper alloy, aluminum, an aluminum alloy, stainless steel, a magnesium alloy, or the like may be used as such a material. In the first embodiment, copper that has superior thermal conductivity is used as the material of the first metal layer 10. The second metal layer 20 may be formed from, for example, a material having high thermal conductivity. For example, copper, a copper alloy, aluminum, an aluminum alloy, stainless steel, a magnesium alloy, or the like may be used as such a material. In the first embodiment, copper that has superior thermal conductivity is used as the material of the second metal layer 20. Preferably, a fluid having a high vapor pressure and a large latent heat of vaporization is used as the working fluid 40. For example, ammonia, water, chlorofluorocarbon, alcohol, or acetone can be used as the material of the working fluid 40.

Figure 1B:
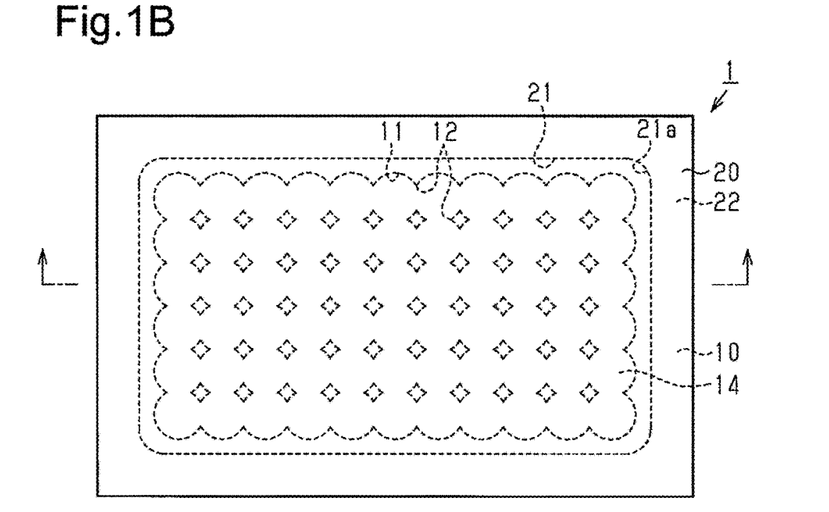
FIG. 1B is a schematic plan view of the heat pipe illustrated in FIG. 1A.

The construction of the heat pipe 1 (first metal layer 10 and second metal layer 20) will now be described. Referring to FIGS. 1A and 1B, the heat pipe 1 has the form of a substantially rectangular plate.

The first metal layer 10 may have a thickness of, for example, 50 to 150 μm. The second metal layer 20 may have a thickness of, for example, 50 to 150 μm. The heat pipe 1 may have a thickness that is the sum of the thickness of the first metal layer 10 and the thickness of the second metal layer 20, for example, 100 to 300 μm. In the first embodiment, the thickness of the first metal layer 10 is 100 μm, and the thickness of the second metal layer 20 is 100 μm. In this case, the thickness of the heat pipe 1 may be 200 μm.

The first metal layer 10 includes a plurality of bottomed holes 11 that are depressed from the upper surface 10a in the thickness-wise direction. Referring to FIG. 1B, in the first embodiment, the bottomed holes 11 are arranged in a grid-like (matrix) array.

Figure 1C:
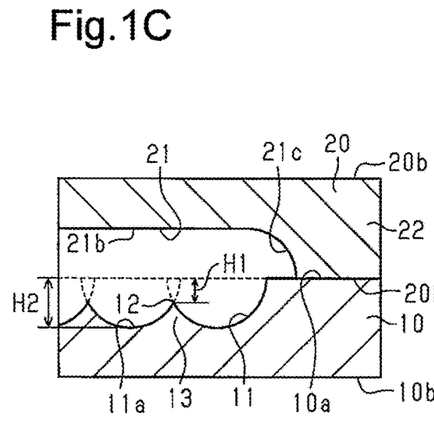
FIG. 1C is a partially enlarged cross-sectional view of FIG. 1A illustrating bottomed holes of the heat pipe.
Figure 1D:
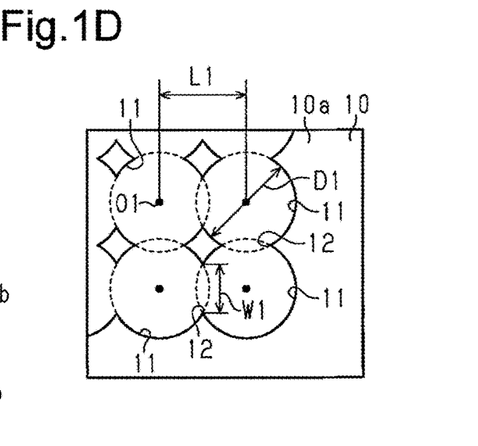
FIG. 1D is a partially enlarged plan view of FIG. 1B illustrating a first metal layer of the heat pipe.

Referring to FIGS. 1C and 1D, in the first embodiment, each bottomed hole 11 is substantially semispherical and has a substantially circular planar shape. Further, in the first embodiment, each bottomed hole 11 is partially overlapped with the adjacent bottomed holes 11 in the upper surface 10a of the first metal layer 10. Referring to FIG. 1D, each bottomed hole 11 has a center O1 and a diameter D1 (inner diameter) in a plan view. The distance L1 between the centers O1 of adjacent bottomed holes 11 is smaller than the diameter D1 of each bottomed hole 11. Thus, adjacent bottomed holes 11 are partially overlapped with one another, and the portions where adjacent bottomed holes 11 overlap one another form communication portions 12. Adjacent bottomed holes 11 are in communication with one another through the communication portions 12. Each bottomed hole 11 is partially overlapped with at least two other bottomed holes 11. Accordingly, the bottomed holes 11 are all in communication with one another. Referring to FIG. 1C, the first metal layer 10 includes dams 13 located between adjacent bottomed holes 11. Each dam 13 projects toward the upper surface 10a of the first metal layer 10 and is located at a higher position than a bottom portion 11a of each bottomed hole 11.

Referring to FIG. 1B, the bottomed holes 11, which are arranged overlapping one another in the upper surface 10a of the first metal layer 10, form a flow passage 14 extending in the arrayed direction of the bottomed holes 11. Referring to FIGS. 1A and 1C, the dams 13 between adjacent bottomed holes 11 define each bottomed hole 11 that is concave. Each bottomed hole 11 does not have to be substantially semispherical. Each bottomed hole 11 may have the form of an inverted taper of which the inner dimension (width) increases from the bottom portion 11a toward the upper surface 10a of the first metal layer 10.

The diameter D1 of each bottomed hole 11 may be, for example, 100 μm. Further, referring to FIG. 1C, a depth H1 of each communication portion 12 (distance from upper surface 10a of first metal layer 10 to lowermost part of communication portion 12) is less than a depth H2 of each bottomed hole 11 (distance from upper surface 10a of first metal layer 10 to bottom portion 11a). The depth H2 of each bottomed hole 11 may be, for example, 50 μm. The depth H1 of each communication portion 12 may be, for example, 10 μm. Referring to FIG. 1D, each communication portion 12 has a width W1 in the upper surface 10a of the first metal layer 10 that is smaller than the diameter D1 of each bottomed hole 11. The width W1 of the communication portion 12 may be, for example, 20 μm.

Referring to FIG. 1A, the second metal layer 20 includes a recess 21 that is depressed from the lower surface 20b toward the upper surface 20a. Referring to FIG. 1B, the recess 21 is substantially rectangular in a plan view and includes arcuate corners 21a. Referring to FIG. 1A, the recess 21 includes side surfaces 21c that extend continuously in an arcuate manner to a ceiling surface 21b of the recess 21. In the second metal layer 20, the ceiling surface 21b of the recess 21 has a height from the lower surface 20b that may be, for example, one-half of the thickness of the second metal layer 20. The height may be, for example, 50 μm.

In the first embodiment, the second metal layer 20 includes a single recess 21. In a plan view, the recess 21 is overlapped with the bottomed holes 11 of the first metal layer 10. The second metal layer 20 includes a frame 22 that defines the recess 21 and surrounds the bottomed holes 11 of the first metal layer 10. The frame 22 includes a lower surface that defines the lower surface 20b of the second metal layer 20. The lower surface 20b is joined with the upper surface 10a of the first metal layer 10 around the bottomed holes 11. The first metal layer 10 and the second metal layer 20 when joined together form the sealed cavity 30 with the bottomed holes 11 of the first metal layer 10 and the recess 21 of the second metal layer 20. Accordingly, the heat pipe 1 includes the sealed cavity 30 formed by the first metal layer 10 and the second metal layer 20 that are joined with each other.

The operation of the heat pipe 1 will now be described.

Referring to FIG. 2, the heat pipe 1 includes the first metal layer 10 and the second metal layer 20, which is joined with the upper surface 10a of the first metal layer 10. The first metal layer 10 includes the bottomed holes 11 that are depressed from the upper surface 10a. Adjacent bottomed holes 11 are in communication with one another. The second metal layer 20 includes the recess 21 that is depressed from the lower surface 20b.

The sealed cavity 30, which is formed by the bottomed holes 11 of the first metal layer 10 and the recess 21 of the second metal layer 20, contains the working fluid 40. The working fluid 40 is dispersed and collected in every one of the bottomed holes 11 because of the capillary force produced by each bottomed hole 11 in the first metal layer 10. Accordingly, the working fluid 40 is continuous inside the sealed cavity 30 in the longitudinal direction of the heat pipe 1 (sideward direction in FIG. 2), and the recess 21 of the second metal layer 20 may entirely be used as a continuous vapor layer.

Figure 3A:
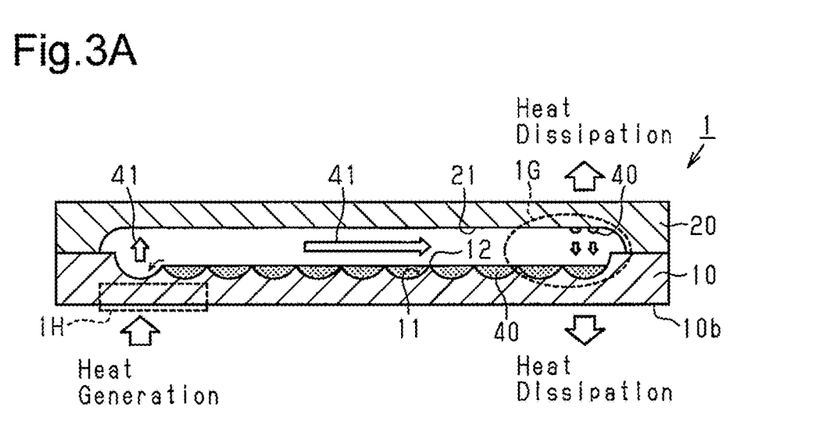
FIG. 3A is a schematic cross-sectional view illustrating the operation of the heat pipe.
Figure 3B:
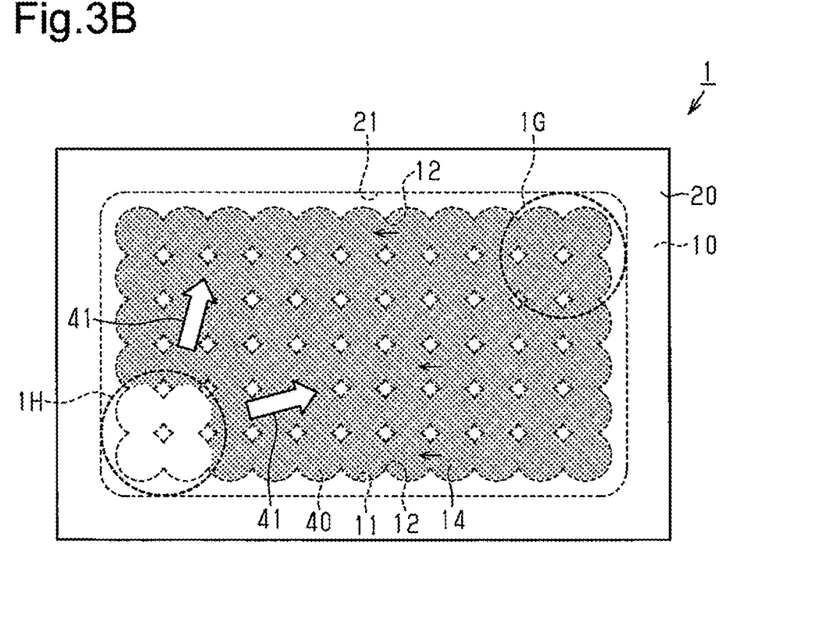
FIG. 3B is a schematic plan view illustrating the operation of the heat pipe.

The heat pipe 1 uses phase transition of the working fluid 40 to transfer heat. FIGS. 3A and 3B illustrate one example in which the lower left portion of the heat pipe 1 is set as a heat generation portion 1H. The heat pipe 1 is arranged so that the heat of a heat-generating component, such as a semiconductor element or a semiconductor device, is transmitted to the heat generation portion 1H. The location of the heat generation portion 1H in the heat pipe 1 is not particularly limited. Referring to FIG. 3B, in a plan view, the bottomed holes 11 are evenly arranged in the heat pipe 1. Thus, the heat pipe 1 may be arranged on a heat-generating component with the heat of the heat-generated component transmitted to any location in the lower surface 10b of the first metal layer 10.

Referring to FIGS. 3A and 3B, when the temperature of the first metal layer 10 rises in the vicinity of the heat generation portion 1H, the working fluid 40 in the vicinity of the heat generation portion 1H vaporizes (evaporates) and produces vapor 41. The vapor 41 moves in the recess 21 of the second metal layer 20. Further, referring to FIG. 3B, the vapor 41 spreads from the heat generation portion 1H throughout the recess 21. The recess 21 of the second metal layer 20 functions as a vapor layer in which the vapor 41 vaporized from the working fluid 40 moves.

A condensation portion 1G of the vapor 41 is formed at a location separated from the heat generation portion 1H. The vapor 41 liquefies at the condensation portion 1G. The working fluid 40 liquefied at the condensation portion 1G falls into the bottomed holes 11 of the first metal layer 10. The capillary force produced at the communication portions 12 between adjacent bottomed holes 11 moves the working fluid 40 between adjacent bottomed holes 11. The working fluid 40 moves toward a location where the working fluid 40 is insufficient, that is, toward the heat generation portion 1H. In the first metal layer 10, adjacent bottomed holes 11 are in communication with one another so that the bottomed holes 11 form a liquid layer in which the working fluid 40 liquefied from the vapor 41 moves. In the example illustrated in FIG. 1A, the bottomed holes 11 and the communication portion 12, through which the bottomed holes 11 are in communication, function as a liquid layer in which the working fluid 40 moves. When the vapor 41 produced in the vicinity of the heat generation portion 1H liquefies (condensates) in the vicinity of the condensation portion 1G, the working fluid 40 moves in the liquid layer toward the heat generation portion 1H and returns to the bottomed holes 11 in the vicinity of the heat generation portion 1H.

Subsequently, evaporation and condensation are performed in cycles, that is, phase transition of the working fluid is repeated to transfer heat from the heat generation portion 1H to the condensation portion 1G. This lowers the temperature of the heat-generating component located at the heat generation portion 1H.

A method for manufacturing the heat pipe 1 (first metal layer 10 and second metal layer 20) will now be described.

Figure 4A:
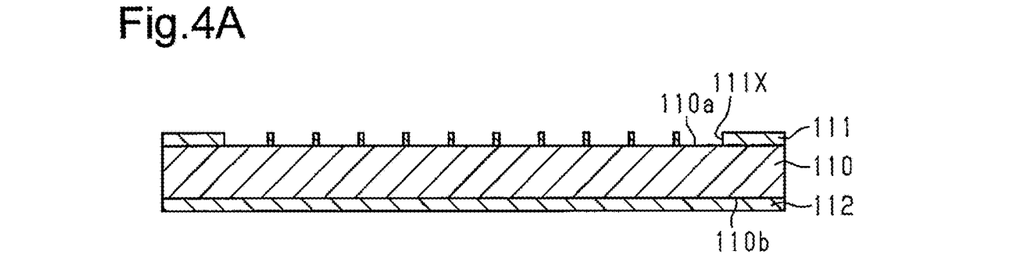
FIGS. 4A to 4E are schematic cross-sectional views illustrating a process for manufacturing the heat pipe illustrated in FIG. 1A.

In the step illustrated in FIG. 4A, a first metal plate 110 is prepared. The first metal plate 110 is used to form the first metal layer 10 illustrated in FIG. 1A. For example, copper, a copper alloy, aluminum, an aluminum alloy, stainless steel, a magnesium alloy, or the like can be used as the material of the first metal plate 110. The first metal plate 110 may have a thickness of, for example, 50 to 150 μm.

An etching mask 111 including an opening 111X is formed on an upper surface 110a of the first metal plate 110. The opening 111X exposes the upper surface 110a of the first metal plate 110 at a location corresponding to the bottomed holes 11 illustrated in FIG. 1A. For example, a resist layer may be used as the etching mask 111. A material resistant to etching that is performed in the subsequent step may be used as the material of the resist layer. For example, a photosensitive dry film resist or a liquid photoresist (e.g., novolac resin or acrylic resin) may be used as the material of the resist layer. For example, when using a photosensitive dry film resist, thermocompression bonding is performed to laminate the dry film onto the upper surface 110a of the first metal plate 110. Then, the dry film is patterned by undergoing exposure and development to form the etching mask 111. When using a liquid photoresist, the same processing may be performed to form the etching mask 111.

A protection layer 112 is formed on a lower surface 110b of the first metal plate 110. When the first metal plate 110 undergoes etching, the protection layer 112 protects the lower surface 110b of the first metal plate 110. For example, a resist layer similar to that of the etching mask 111 may be used as the protection layer 112. However, the material of the protection layer 112 may differ from that of the etching mask 111.

Figure 4B:
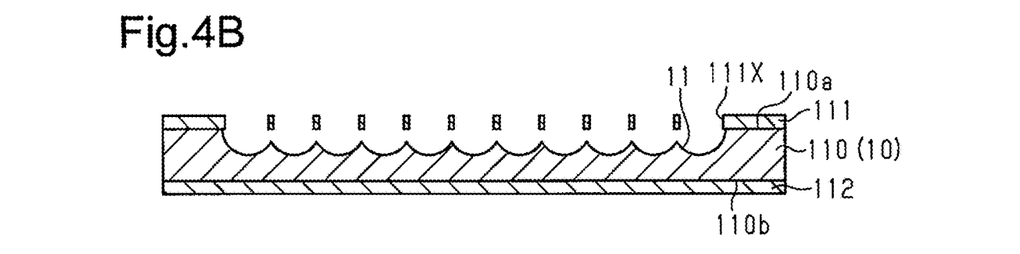

In the step illustrated in FIG. 4B, etching is performed on the first metal plate 110 through the opening 111X of the etching mask 111 to form the bottomed holes 11 having a certain depth in the first metal plate 110. For example, when the first metal plate 110 is formed from copper, an iron(III) chloride solution or a copper(II) chloride solution may be used as the etching liquid. Etching may be performed by a device such as a spray etching device.

Then, the etching mask 111 and the protection layer 112 are removed. When using a resist layer as the etching mask 111, the etching mask 111 may be removed by performing asking or by using an alkali delamination liquid. In the same manner, when using a resist layer as the protection layer 112, the protection layer 112 may be removed in the same manner as the etching mask 111. This obtains the first metal layer 10 that includes the bottomed holes 11.

Figure 4C:
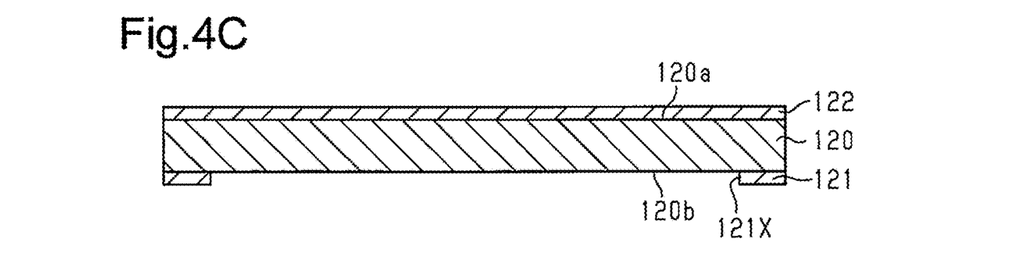

In the step illustrated in FIG. 4C, a second metal plate 120 is prepared. The second metal plate 120 is used to form the second metal layer 20 illustrated in FIG. 1A. For example, copper, a copper alloy, aluminum, an aluminum alloy, stainless steel, a magnesium alloy, or the like can be used as the material of the second metal plate 120. The second metal plate 120 may have a thickness of, for example, 50 to 150 μm.

An etching mask 121 including an opening 121X is formed on the lower surface 120b of the second metal plate 120. The opening 121X exposes the lower surface 120b of the second metal plate 120 at a location corresponding to the recess 21 illustrated in FIG. 1A. For example, a resist layer may be used as the etching mask 121. A material resistant to etching performed in the subsequent step may be used as the material of the resist layer. For example, a photosensitive dry film resist or a liquid photoresist (e.g., novolac resin or acrylic resin) may be used as the material of the resist layer. For example, when using a photosensitive dry film resist, thermocompression bonding is performed to laminate the dry film onto the lower surface 120b of the second metal plate 120. Then, the dry film is patterned by undergoing exposure and development to form the etching mask 121. When using a liquid photoresist, the same processing may be performed to form the etching mask 121.

A protection layer 122 is formed on an upper surface 120a of the second metal plate 120. When the second metal plate 120 undergoes etching, the protection layer 122 protects the upper surface 120a of the second metal plate 120. For example, a resist layer similar to that of the etching mask 121 may be used as the protection layer 122. However, the material of the protection layer 122 may differ from that of the etching mask 121.

Figure 4D:
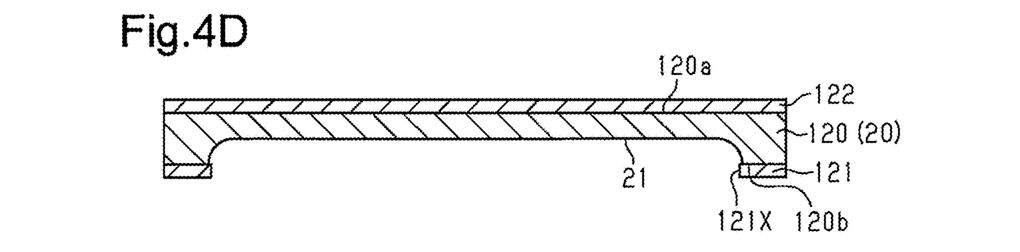

In the step illustrated in FIG. 4D, etching is performed on the second metal plate 120 through the opening 121X of the etching mask 121 to form the recess 21 having a certain depth in the second metal plate 120. For example, when the second metal plate 120 is formed from copper, an iron(III) chloride solution or a copper(II) chloride solution may be used as the etching liquid. Etching may be performed by a device such as a spray etching device. The portion of the second metal plate 120 where the lower surface 120b remains subsequent to the etching, that is, the portion covered by the etching mask 121 serves as the frame 22 illustrated in FIG. 1A.

Then, the etching mask 121 and the protection layer 122 are removed. When using a resist layer as the etching mask 121, the etching mask 121 may be removed by performing asking or by using an alkali delamination liquid. In the same manner, when using a resist layer as the protection layer 122, the protection layer 122 may be removed in the same manner as the etching mask 121. This obtains the second metal layer 20 that includes the recess 21.

Figure 4E:
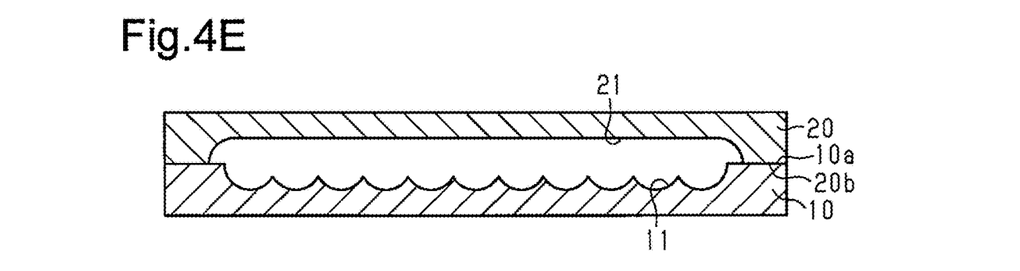

In the step illustrated in FIG. 4E, the lower surface 20b of the second metal layer 20 is joined with the upper surface 10a of the first metal layer 10. Diffusion bonding (thermocompression bonding) that heats and presses the first and second metal layers 10 and 20 may be performed to join the first and second metal layers 10 and 20. To join the first and second metal layers 10 and 20 in a satisfactory manner, it is preferred that the first and second metal layers 10 and 20 be formed from the same material. Other bonding processes such as friction bonding may be performed to bond the first and second metal layers 10 and 20.

This directly bonds the first metal layer 10 and the second metal layer 20 with each other and obtains the heat pipe 1 that includes the cavity 30. A vacuum pump or the like is used to remove gas from the cavity 30. A working fluid is fed into the cavity 30 through an inlet (not illustrated). Then, the inlet is closed to seal the cavity 30 and form a sealed cavity.

The first embodiment has the advantages described below.

(1-1) The heat pipe 1 is a laminated structure of the first metal layer 10 and the second metal layer 20. The first metal layer 10 includes the bottomed holes 11 that are depressed in the thickness-wise direction from the upper surface 10a. The bottomed holes 11 are arranged partially overlapping adjacent bottomed holes 11 in the upper surface 10a of the first metal layer 10. Overlapping portions of adjacent bottomed holes 11 define the communication portions 12. The communication portions 12 are formed at a lower position than the upper surface 10a of the first metal layer 10. Adjacent bottomed holes 11 are in communication with one another through the communication portions 12. In the first embodiment, the second metal layer 20 includes the single recess 21 depressed from the lower surface 20b toward the upper surface 20a. In a plan view, the recess 21 is overlapped with the bottomed holes 11 of the first metal layer 10.

The recess 21 of the second metal layer 20 functions as a vapor layer in which the vapor 41 vaporized from the working fluid 40 moves. The bottomed holes 11 of the first metal layer 10 and the communication portions 12 function as a liquid layer in which the working fluid 40 moves. Accordingly, the heat pipe 1 includes the vapor layer and the liquid layer inside the joined first and second metal layers 10 and 20. This allows the heat pipe 1 to be reduced in thickness.

(1-2) In the first metal layer 10, the bottomed holes 11 are arranged in a grid-like (matrix) array. The bottomed holes 11 are evenly arranged in the upper surface 10a of the first metal layer 10. Thus, the heat generation portion 1H (evaporation portion) and the condensation portion 1G are not isolated from each other, and any location on the heat pipe 1 can be used as the heat generation portion 1H where a heat-generated component such as a semiconductor element or a semiconductor device is arranged. The vapor 41 produced in the vicinity of the heat generation portion 1H spreads out in all directions in the vapor layer (recess 21). The condensation portion 1G forms at a portion where the temperature is lower. The condensation portion 1G liquefies the vapor 41. This structure results in the heat pipe 1 uniformly dissipating heat in all directions regardless of how the heat pipe 1 is arranged.

Second Embodiment

A second embodiment of a heat pipe 200 will now be described. Same reference numerals are given to those components that are the same as the corresponding components of the first embodiment. Such components will not be described in detail.

Figure 5A:
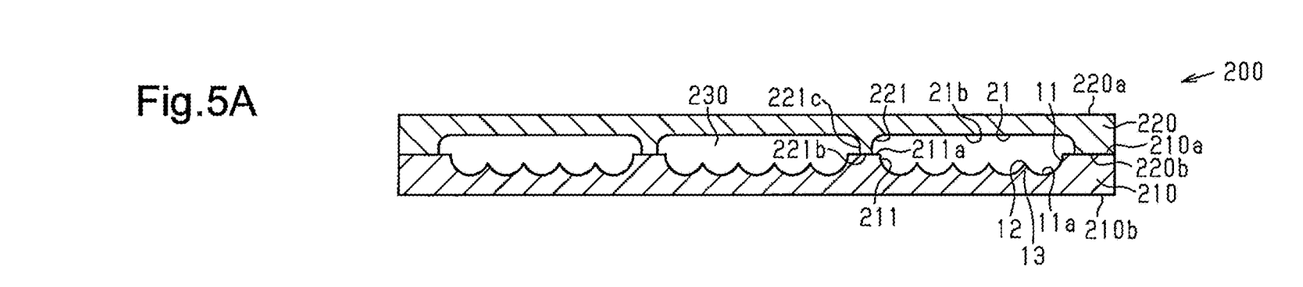
FIG. 5A is a schematic cross-sectional view of a second embodiment of the heat pipe
Figure 5B:
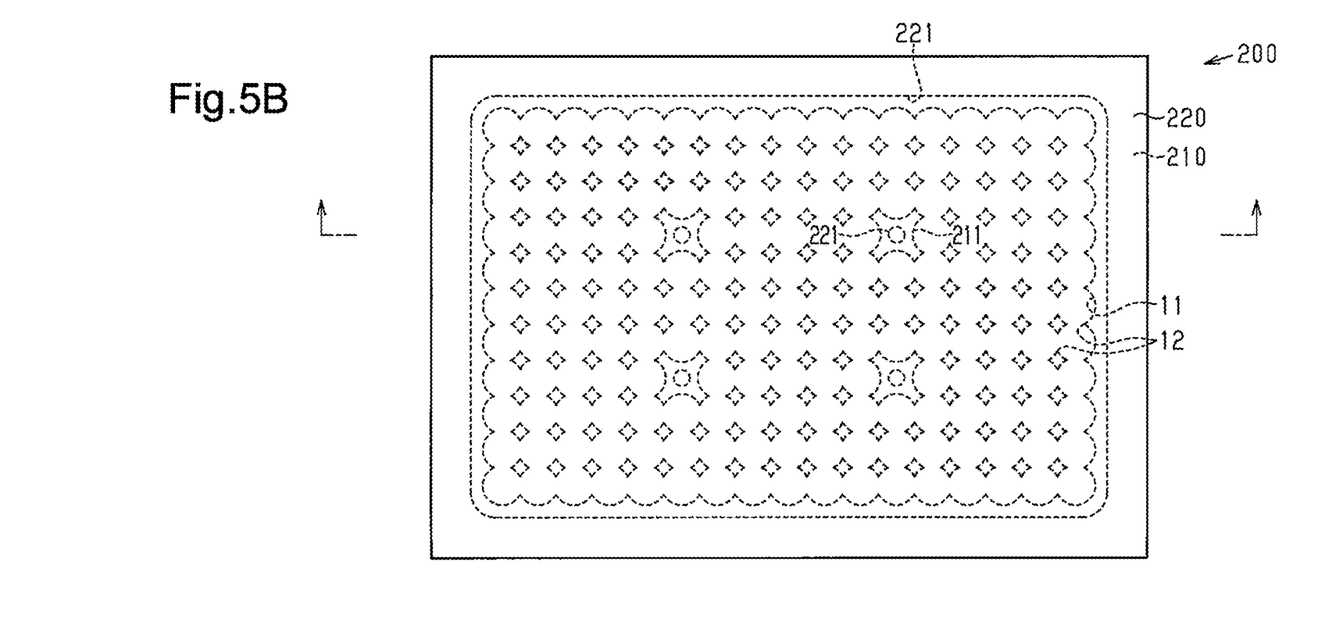
FIG. 5B is a schematic plan view of the heat pipe illustrated in FIG. 5A.

Referring to FIGS. 5A and 5B, the heat pipe 200 is a laminated structure of a first metal layer 210 and a second metal layer 220. The heat pipe 200 has the form of a substantially rectangular plate.

The first metal layer 210 includes an upper surface 210a and a lower surface 210b. The second metal layer 220 includes an upper surface 220a and a lower surface 220b. The lower surface 220b of the second metal layer 220 is joined with the upper surface 210a of the first metal layer 210. The first and second metal layers 210 and 220 are joined through a solid state bonding process such as diffusion bonding or thermocompression bonding. The first metal layer 210 and the second metal layer 220 when joined together form a sealed cavity 230. The sealed cavity 230 of the heat pipe 200 contains a given amount of a working fluid (not illustrated).

The first metal layer 210 may have a thickness of, for example, 50 to 150 μm. The second metal layer 220 may have a thickness of, for example, 50 to 150 μm. The heat pipe 200 may have a thickness that is the sum of the thickness of the first metal layer 210 and the thickness of the second metal layer 220, for example, 100 to 300 μm. In the second embodiment, the thickness of the first metal layer 210 is 100 μm, and the thickness of the second metal layer 220 is 100 μm. In this case, the thickness of the heat pipe 200 is 200 μm.

The first metal layer 210 includes the bottomed holes 11 that are depressed from the upper surface 210a in the thickness-wise direction. As shown in FIG. 5B, in the second embodiment, the bottomed holes 11 are arranged in a grid-like (matrix) array. In the second embodiment, each bottomed hole 11 is partially overlapped with the adjacent bottomed holes 11 in the upper surface 210a of the first metal layer 210. Portions where adjacent bottomed holes 11 overlap one another define the communication portions 12. Adjacent bottomed holes 11 are in communication with one another through the communication portions 12. The first metal layer 210 includes the dams 13 located between adjacent bottomed holes 11. Each dam 13 projects toward the upper surface 210a of the first metal layer 210 and is located at a higher position than the bottom portion 11a of each bottomed hole 11.

Further, the first metal layer 210 includes one or more (for example, four in this case) supports 211. In the second embodiment, each support 211 is arranged in the same line and row as one of the bottomed holes 11. The positions where the supports 211 are located may be changed as required. Each support 211 includes an upper surface 211a located at the same height as the upper surface 210a of the first metal layer 210. The supports 211 may be formed by, for example, changing the shape of the etching mask 111 (refer to FIG. 4A), which is used to form the bottomed holes 11, so that the etching mask 111 covers the upper surface 110a of the first metal plate 110 at locations corresponding to the supports 211.

The second metal layer 220 includes one or more (for example, four in this case) posts 221 located inside the recess 21. The number of the posts 221 may be changed as required. The posts 221 are located at positions corresponding to the supports 211 of the first metal layer 210. Each post 221 extends from the ceiling surface 21b of the recess 21 to the lower surface 220b of the second metal layer 220.

Each post 221 includes a lower surface 221b located at the same height as the lower surface 220b of the second metal layer 220. The lower surface 221b of each post 221 is circular in a plan view. Alternatively, the lower surface 221b may have any shape such as a triangular or quadrangular shape in a plan view. Each post 221 includes a curved side surface 221c that widens as the ceiling surface 21b of the recess 21 becomes closer. The posts 221 may be formed by, for example, changing the shape of the etching mask 121 (refer to FIG. 4C), which is used to form the recess 21, so that the etching mask 121 covers the lower surface 120b of the second metal plate 120 at locations corresponding to the posts 221.

The second embodiment has the advantages described below.

(2-1) The heat pipe 200 has the same advantages as the first embodiment of the heat pipe 1.

(2-2) The heat pipe 200 is a laminated structure of the first metal layer 210 and the second metal layer 220. The first metal layer 210 includes the supports 211. The second metal layer 220 includes the posts 221 inside the recess 21. The lower surface 221b of each post 221 contacts the upper surface 211a of the corresponding support 211. The supports 211 and the posts 221 reduce warping of the first metal layer 210 and the second metal layer 220 and maintain the sealed cavity 230 in a preferred manner. As a result, the liquid layer and vapor layer of the working fluid are maintained in a preferred manner. Further, the first metal layer 210 and the second metal layer 220 are further accurately joined.

(2-3) Preferably, the lower surface 221b of each post 221 is joined with the upper surface 211a of the corresponding support 211. By joining the posts 221 and the supports 211, expansion of the heat pipe 200 caused by vapor can be limited.

It should be apparent to those skilled in the art that the foregoing embodiments may be implemented in many other specific forms without departing from the scope of this disclosure. Particularly, it should be understood that the foregoing embodiments may be implemented in the following forms.

In the description hereafter, same reference numerals are given to those components that are the same as the corresponding components of the above embodiments. Such components will not be described in detail.

In each embodiment, the shapes of the first metal layers 10 and 210 may be changed as required. For example, the arrayed direction, planar shapes, cross-sectional shapes, and/or size of the bottomed holes 11 may be changed as required.

Figure 6:
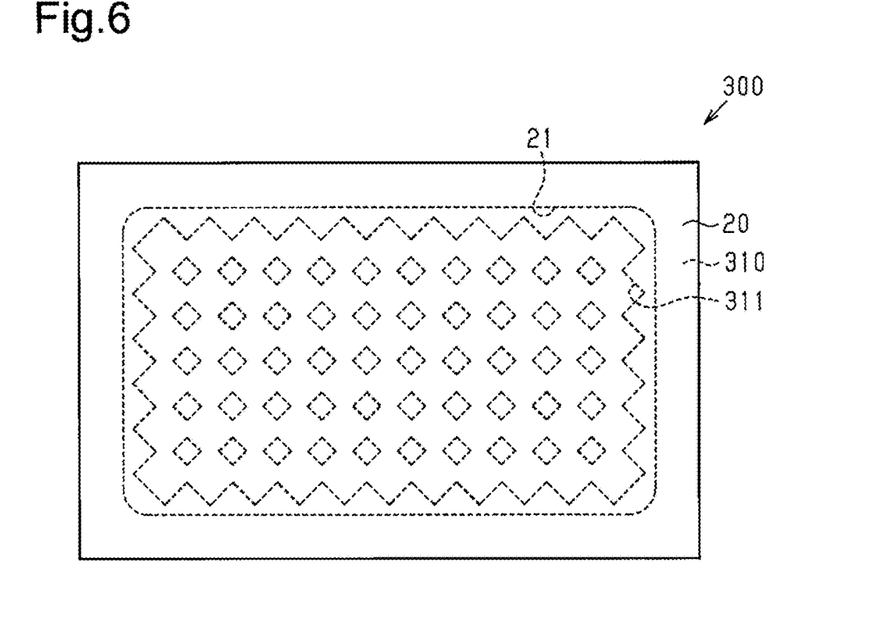
FIGS. 6 to 9 are schematic plan views illustrating various modified examples of the heat pipe.

FIG. 6 illustrates a heat pipe 300 including a first metal layer 310 and the second metal layer 20. The first metal layer 310 includes a plurality of bottomed holes 311. The bottomed holes 311 are arranged in a grid-like (matrix) array. Each bottomed hole 311 has a quadrangular shape in a plan view. The quadrangular shape includes shapes with chamfered or rounded corners. Further, a quadrangle does not have to include two opposing sides that are perfectly parallel with each other.

Figure 7:
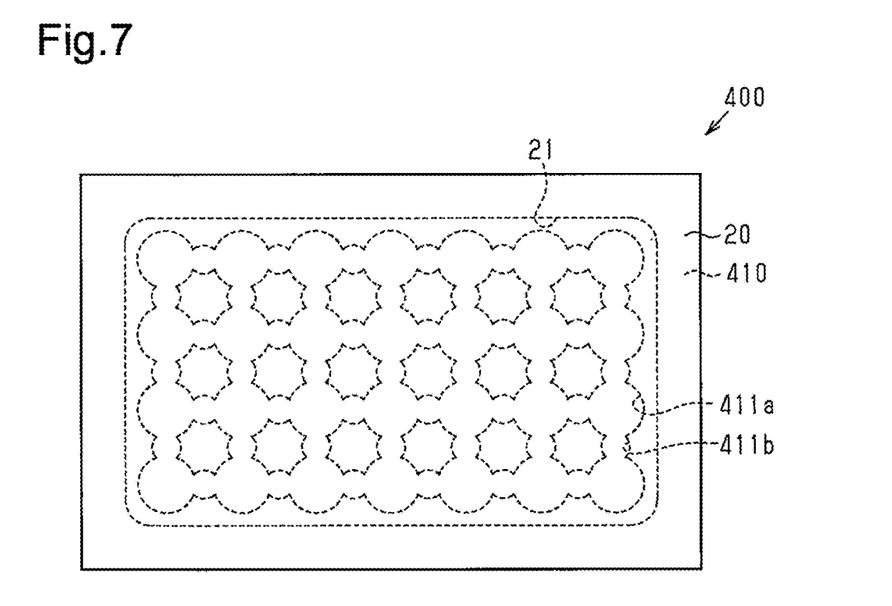

FIG. 7 illustrates a heat pipe 400 including a first metal layer 410 and the second metal layer 20. The first metal layer 410 includes a plurality of first bottomed holes 411a and a plurality of second bottomed holes 411b. The bottomed holes 411a are arranged in a grid-like (matrix) array. In a plan view, each first bottomed hole 411a has a size that differs from that of each second bottomed hole 411b. For example, each second bottomed hole 411b has a smaller inner diameter than that of each first bottomed hole 411a. The second bottomed holes 411b are arranged between the first bottomed holes 411a in the arrayed directions of the first bottomed holes 411a.

Figure 8:
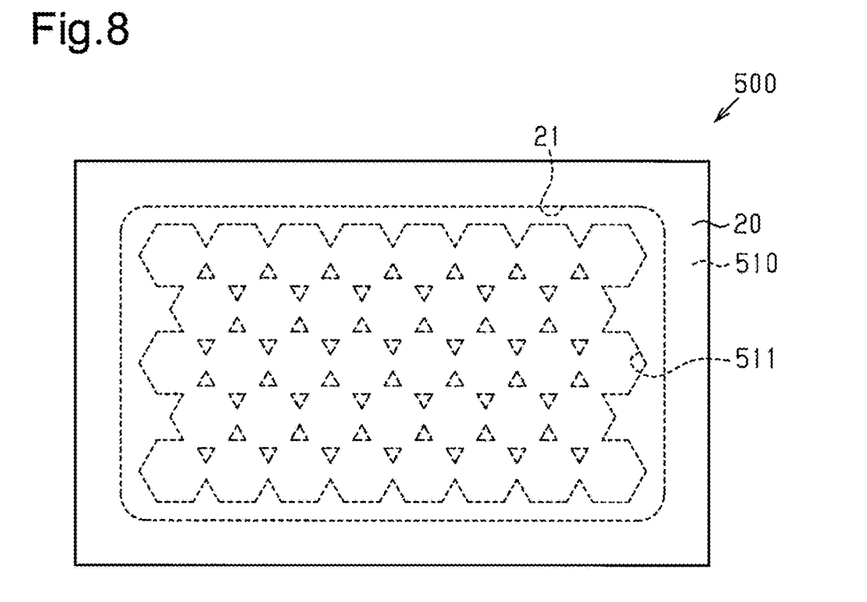

FIG. 8 illustrates a heat pipe 500 including a first metal layer 510 and the second metal layer 20. The first metal layer 510 includes a plurality of bottomed holes 511. The bottomed holes 511 are arrayed in the longitudinal direction of the heat pipe 500 (sideward direction in FIG. 8) and in a direction extending at a certain angle (e.g., 60 degrees) with respect to the longitudinal direction. In the heat pipe 500, each bottomed hole 511 has a hexagonal shape in a plan view. In a plan view, each bottomed hole 511 may have a circular shape like in the above embodiments, the shape of polygon other than a hexagon, or any other shape. Polygonal shapes include shapes with chamfered or rounded corners.

Figure 9:
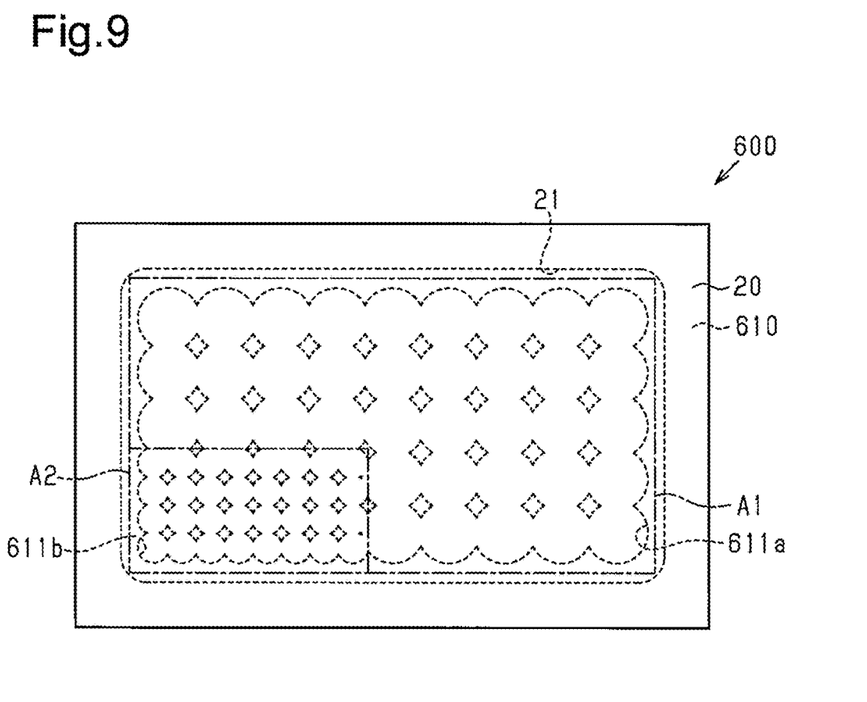

FIG. 9 illustrates a heat pipe 600 including a first metal layer 610 and the second metal layer 20. The first metal layer 610 includes a plurality of first bottomed holes 611a and a plurality of second bottomed holes 611b. In a plan view, each first bottomed hole 611a has a size that differs from that of each second bottomed hole 611b. For example, each second bottomed hole 611b has a smaller inner diameter than that of each first bottomed hole 611a. The first metal layer 610 includes a first region A1 in which the first bottomed holes 611a are located and a second region A2 in which the second bottomed holes 611b are located. Since the inner diameter of the second bottomed holes 611b is smaller than the inner diameter of the first bottomed holes 611a, a larger capillary force acts on the working fluid and moves the working fluid more smoothly at communication portions located between each second bottomed hole 611b and the adjacent second bottomed holes 611b. Thus, when the second region A2 including the second bottomed holes 611b is used as the heat generation portion 1H (evaporation portion), the effect for reducing the temperature of the heat-generating component can be greatly improved.

In each of the above embodiments, the shapes of the second metal layers 20 and 220 may be changed as required.

Figure 10:
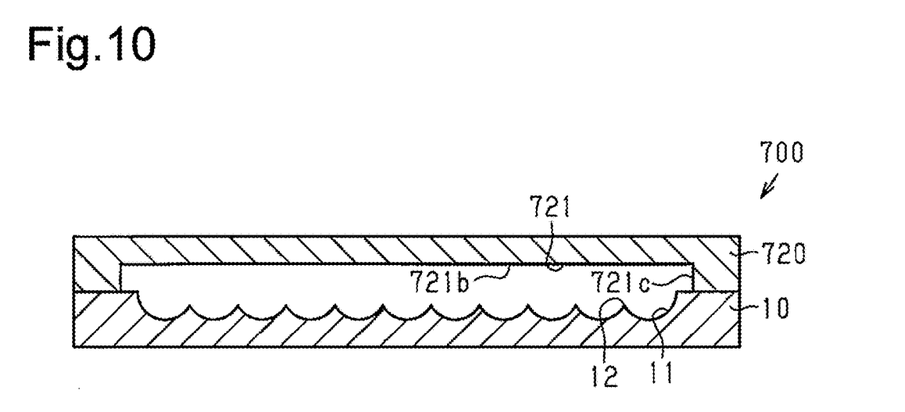
FIG. 10 is a schematic cross-sectional view illustrating another modified example of the heat pipe.

FIG. 10 illustrates a heat pipe 700 including the first metal layer 10 and a second metal layer 720. The second metal layer 720 includes a ceiling surface 721b, side surfaces 721c, and a recess 721 defined by the ceiling surface 721b and the side surfaces 721c. In the second metal layer 720, the ceiling surface 721b is substantially orthogonal to the side surfaces 721c.

The above embodiments and the above modified examples may be combined as required.

CLAUSES

This disclosure further encompasses embodiments described below.

1. A method for manufacturing a heat pipe, the method including:

forming a plurality of bottomed holes in a first metal plate by etching the first metal plate from an upper surface of the first metal plate;

forming a recess in a second metal plate by etching a second metal plate from a lower surface of the second metal plate;

joining the lower surface of the second metal plate with the upper surface of the first metal plate; and feeding a cavity formed by the joined first and second metal plates with a working fluid through an inlet and sealing the inlet, wherein the recess forms a vapor layer in which vapor vaporized from the working fluid moves, and the forming a plurality of bottomed holes includes partially overlapping adjacent ones of the plurality of bottomed holes so that the adjacent ones of the plurality of bottomed holes are in communication and so that the plurality of bottomed holes form a liquid layer in which the working fluid liquefied from the vapor moves.

2. The method according to clause 1, wherein the forming a plurality of bottomed holes includes forming the plurality of bottomed holes while forming a support having a height that is the same as that of the upper surface of the first metal plate, and the forming a recess includes forming the recess while forming a post that extends to the lower surface of the second metal plate inside the recess.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A heat pipe containing a working fluid, the heat pipe comprising:

a first metal layer including an upper surface and a plurality of bottomed holes depressed from the upper surface; and a second metal layer including a lower surface that is joined with the upper surface of the first metal layer and a recess that is depressed from the lower surface, wherein the recess forms a vapor layer in which vapor vaporized from the working fluid moves, and adjacent ones of the plurality of bottomed holes are in communication with each other so that the plurality of bottomed holes form a liquid layer in which the working fluid liquefied from the vapor moves.

2. The heat pipe according to claim 1, wherein the adjacent ones of the plurality of bottomed holes are partially overlapped with each other and form a communication portion through which the adjacent ones of the plurality of bottomed holes are in communication, the communication portion has a width that is smaller than an inner diameter of each of the plurality of bottomed holes, and the communication portion has a depth that is smaller than a depth of each of the plurality of bottomed holes.

3. The heat pipe according to claim 1, wherein the first metal layer includes a support having a height that is the same as that of the upper surface of the first metal layer, the second metal layer includes a post located inside the recess, and the post extends from a ceiling surface of the recess to the lower surface of the second metal layer and is joined with the support.

4. The heat pipe according to claim 1, wherein the plurality of bottomed holes include a plurality of first bottomed holes arranged in a grid-like array, and a plurality of second bottomed holes arranged between the plurality of first bottomed holes in an arrayed direction of the plurality of first bottomed holes, wherein each of the plurality of second bottomed holes has an inner diameter that is smaller than that of each of the plurality of first bottomed holes.

5. The heat pipe according to claim 1, wherein the plurality of bottomed holes include a plurality of first bottomed holes located in a first region of the first metal layer, a plurality of second bottomed holes located in a second region of the first metal layer, wherein each of the plurality of second bottomed holes has an inner diameter that is smaller than that of each of the plurality of first bottomed holes.

6. The heat pipe according to claim 1, wherein each of the plurality of bottomed holes in a plan view has a circular shape, a quadrangular shape, or a polygonal shape.

7. The heat pipe according to claim 1, wherein the heat pipe has a thickness that is a sum of a thickness of the first metal layer and a thickness of the second metal layer.

* * * * *